US009497826B2

(12) United States Patent
von Malm et al.

(10) Patent No.: US 9,497,826 B2
(45) Date of Patent: Nov. 15, 2016

(54) LIGHT-EMITTING DIODE ARRANGEMENT AND LIGHT-EMITTING MEANS, IN PARTICULAR WITH SUCH A LIGHT-EMITTING DIODE ARRANGEMENT

(75) Inventors: Norwin von Malm, Nittendorf-Thumhausen (DE); Hubert Maiwald, Neutraubling (DE); Robert Kraus, Regensburg (DE); Patrick Rode, Regensburg (DE); Ralph Wirth, Lappersdorf (DE)

(73) Assignee: OSRAM Opto Semiconductors GmbH (DE)

( * ) Notice: Subject to any disclaimer, the term of this patent is extended or adjusted under 35 U.S.C. 154(b) by 265 days.

(21) Appl. No.: 13/702,347

(22) PCT Filed: Apr. 13, 2011

(86) PCT No.: PCT/EP2011/055848
§ 371 (c)(1),
(2), (4) Date: Feb. 14, 2013

(87) PCT Pub. No.: WO2011/154180
PCT Pub. Date: Dec. 15, 2011

(65) Prior Publication Data
US 2013/0134881 A1    May 30, 2013

(30) Foreign Application Priority Data
Jun. 10, 2010   (DE) .................. 10 2010 023 342

(51) Int. Cl.
*H05B 37/00*   (2006.01)
*F21V 23/02*   (2006.01)
(Continued)

(52) U.S. Cl.
CPC .............. *H05B 37/00* (2013.01); *F21K 9/232* (2016.08); *F21K 9/233* (2016.08); *F21V 23/026* (2013.01);
(Continued)

(58) Field of Classification Search
CPC .......... H05B 41/2827; H05B 33/0809; H05B 33/0815; H05B 41/3927; H05B 33/0806; H05B 33/0812; H05B 41/2855; H05B 33/08; H05B 33/0842; H01L 41/107; H01L 41/044
USPC .......... 315/276, 209 PZ, 291, 307, 224, 247, 315/294, 312, 113
See application file for complete search history.

(56) References Cited

U.S. PATENT DOCUMENTS 6,057,653 A * 5/2000 Miyazaki ................ H01J 61/56
315/224
6,149,283 A * 11/2000 Conway .................. F21S 10/02
362/236

(Continued)

FOREIGN PATENT DOCUMENTS

DE         100 25 028 C2    3/2002
DE    10 2005 025 623 A1   12/2006
(Continued)

OTHER PUBLICATIONS

Jun Hui Hu et al., "A ring-shaped piezoelectric transformer operating in the third symmetric extensional vibration mode," Sensors and Actuators A, vol. 88, 2001, pp. 79-86.
(Continued)

*Primary Examiner* — Don Le
(74) *Attorney, Agent, or Firm* — DLA Piper LLP (US)

(57) ABSTRACT

A light-emitting diode arrangement includes a piezoelectric transformer having at least one output connection position, and a high-voltage light-emitting diode including a high-voltage light-emitting diode chip including at least two active regions connected in series with one another, wherein the high-voltage light-emitting diode is electrically connected to the output connection position of the piezo transformer.

15 Claims, 8 Drawing Sheets

(51) Int. Cl.
  *H01L 25/075* (2006.01)
  *H01L 41/04* (2006.01)
  *H01L 41/107* (2006.01)
  *H05B 33/08* (2006.01)
  *F21V 29/70* (2015.01)
  *F21V 29/74* (2015.01)
  *F21V 3/00* (2015.01)
  *H01L 33/08* (2010.01)
  *H01L 33/62* (2010.01)
  *H01L 33/64* (2010.01)
  *F21V 29/89* (2015.01)
  *F21Y 101/00* (2016.01)

(52) U.S. Cl.
  CPC ............... *F21V 29/70* (2015.01); *F21V 29/74* (2015.01); *H01L 25/0753* (2013.01); *H01L 41/044* (2013.01); *H01L 41/107* (2013.01); *H05B 33/0806* (2013.01); *F21V 3/00* (2013.01); *F21V 29/89* (2015.01); *F21Y 2101/00* (2013.01); *F21Y 2105/10* (2016.08); *F21Y 2115/10* (2016.08); *H01L 33/08* (2013.01); *H01L 33/62* (2013.01); *H01L 33/647* (2013.01); *H01L 2224/48091* (2013.01); *H01L 2224/73265* (2013.01)

(56) References Cited

U.S. PATENT DOCUMENTS

| | | | |
|---|---|---|---|
| 7,745,970 | B2 | 6/2010 | Radecker et al. |
| 2005/0225973 | A1* | 10/2005 | Eliashevich .......... H01L 27/153 362/217.1 |
| 2006/0097653 | A1* | 5/2006 | Chou .................... H05B 41/00 315/209 R |
| 2006/0274531 | A1 | 12/2006 | Kopf et al. |
| 2007/0024254 | A1* | 2/2007 | Radecker .............. H02M 7/537 323/247 |
| 2008/0024070 | A1* | 1/2008 | Catalano et al. ......... 315/185 R |
| 2008/0084694 | A1* | 4/2008 | Rose ........................ F21V 5/04 362/240 |
| 2008/0186702 | A1* | 8/2008 | Camras .................. H01L 33/58 362/231 |
| 2008/0258629 | A1* | 10/2008 | Akashi .................... H01J 61/24 315/112 |
| 2009/0050908 | A1* | 2/2009 | Yuan ........................ F21K 9/00 257/88 |
| 2010/0109487 | A1* | 5/2010 | Yoon .................. H05B 41/2822 310/366 |
| 2010/0140636 | A1* | 6/2010 | Donofrio ................ H01L 33/46 257/98 |
| 2010/0219758 | A1* | 9/2010 | Melzner .................... F21K 9/00 315/113 |
| 2011/0069500 | A1* | 3/2011 | Meyer, IV ............. F21V 29/20 362/373 |
| 2012/0086026 | A1 | 4/2012 | Engl et al. |

FOREIGN PATENT DOCUMENTS

| | | |
|---|---|---|
| DE | 10 2006 022 819 A1 | 1/2007 |
| DE | 10 2007 044 567 A | 3/2009 |
| DE | 10 2008 011 848 A1 | 9/2009 |
| DK | 176870 B1 | 2/2010 |
| EP | 1 729 059 A2 | 12/2006 |
| JP | 55-029178 A | 3/1980 |
| WO | 01/91519 A1 | 11/2001 |
| WO | 2008/040300 A1 | 4/2008 |
| WO | 2009/089529 A1 | 7/2009 |
| WO | 2009/101176 A1 | 8/2009 |

OTHER PUBLICATIONS

F.E. Bisogno et al., "A Line Power-Supply for LED Lighting using Piezoelectric Transformers in Class-E Topology," Fraunhofer Institute für Autonome Intelligente Systeme—AIS, 2006 IEEE, pp. 1-5.

Mingsen Guo et al., "A study on the disk-shaped piezoelectric transformer with multiple outputs," Review of Scientific Instruments, vol. 78, 2007, pp. 125103-1-125103-7.

Do Manh Cuong, "Piezoelectric Transformer Integration Possibility in High Power Density Applications," TUDpress, Technische Universität Dresden, 2008, pp. 82-84.

* cited by examiner

LIGHT-EMITTING DIODE ARRANGEMENT AND LIGHT-EMITTING MEANS, IN PARTICULAR WITH SUCH A LIGHT-EMITTING DIODE ARRANGEMENT

RELATED APPLICATIONS

This is a §371 of International Application No. PCT/EP2011/055848, with an international filing date of Apr. 13, 2011 (WO 2011/154180 A2, published Dec. 15, 2011), which is based on German Patent Application No. 10 2010 023 342.0, filed Jun. 10, 2010, the subject matter of which is incorporated herein by reference.

TECHNICAL FIELD

This disclosure relates to a light-emitting diode arrangement and light-emitting device which may in particular comprise such a light-emitting diode arrangement.

SUMMARY

We provide a light-emitting diode arrangement including a piezo transformer having at least one output connection position, and a high-voltage light-emitting diode including a high-voltage light-emitting diode chip including at least two active regions connected in series with one another, wherein the high-voltage light-emitting diode is electrically connected to the output connection position of the piezo transformer.

We also provide a light-emitting device including at least one light-emitting diode arrangement including a piezo transformer having at least one input connection position and at least one output connection position, and a light-emitting diode including a light-emitting diode chip, a housing body enclosing a volume in which the light-emitting diode arrangement is fully arranged, a base including at least one base contact, wherein the light-emitting diode electrically connects to the output connection position of the piezo transformer, and the at least one input connection position of the piezo transformer electrically conductively connects to the at least one base contact.

We further provide a light-emitting diode arrangement including a piezo transformer having at least one output connection position, and a high-voltage light-emitting diode including a high-voltage light-emitting diode chip including at least two active regions connected in series with one another, wherein the high-voltage light-emitting diode electrically connects to the output connection position of the piezo transformer, wherein the piezo transformer is a frame and the piezo transformer laterally encloses at least one of the high-voltage light-emitting diodes.

DETAILED DESCRIPTION

The light-emitting diode arrangement may comprise a piezo transformer. In comparison, for example, with a magnetically operating transformer, a piezo transformer is distinguished by its high efficiency and its small volume. The piezo transformer contains or consists of at least one ceramic material. In particular, the piezo transformer may contain a lead zirconate titanate (PZT) as ceramic material. It is furthermore possible for the piezo transformer to be free of heavy metals. Piezo transformers are described, for example, in DK 176870 B1 and US 2007/0024254 A1, the contents of which are hereby incorporated by reference.

The piezo transformer preferably has at least one output connection position. At the output connection position, the piezo transformer provides electrical current and voltage for operating a component to be connected to the output connection position. The piezo transformer may comprise more than one output connection position.

The light-emitting diode arrangement may comprise a high-voltage light-emitting diode, which comprises a high-voltage light-emitting diode chip. A high-voltage light-emitting diode chip is in this case a light-emitting diode chip which comprises at least two active regions connected in series with one another. Each of the active regions generates electromagnetic radiation during operation of the high-voltage light-emitting diode chip. The high-voltage light-emitting diode chip may comprise two or more active regions connected in series with one another. For example, the high-voltage light-emitting diode chip comprises ten or more active regions connected in series with one another. The active regions may be stacked vertically above one another and/or arranged laterally next to one another.

The high-voltage light-emitting diode may be electrically connected to the output connection position of the piezo transformer. That is to say, the high-voltage light-emitting diode is supplied with current and voltage by the piezo transformer through the output connection position of the piezo transformer.

The high-voltage light-emitting diode may in this case consist of the high-voltage light-emitting diode chip or contain the high-voltage light-emitting diode chip. If the high-voltage light-emitting diode contains the high-voltage light-emitting diode chip, then the high-voltage light-emitting diode may comprise further components in addition to the high-voltage light-emitting diode chip, for example, further (high-voltage) light-emitting diode chips, ESD protection components, housing components and the like.

The light-emitting diode arrangement may comprise a piezo transformer having at least one output connection position, and a high-voltage light-emitting diode comprising a high-voltage light-emitting diode chip. The high-voltage light-emitting diode in this case electrically connects to the output connection position of the piezo transformer and the high-voltage light-emitting diode chip comprises at least two active regions connected in series with one another.

The light-emitting diode arrangement described here is based inter alia on the discovery that when using a high-voltage light-emitting diode, across which there is a relatively large voltage drop during operation compared with a conventional light-emitting diode, an efficiency advantage can be achieved over the use of conventional light-emitting diodes, which results from the smaller voltage difference between the mains voltage, which is applied to the input of the piezo transformer, and the high-voltage light-emitting diode operating voltage. The use of a piezo transformer furthermore leads to a space advantage, since the light-emitting diode arrangement can be made particularly small owing to the relatively small volume of the piezo transformer compared with a magnetically operating transformer.

There may be a voltage drop of at least 4 V across the high-voltage light-emitting diode chip of the high-voltage light-emitting diode. For example, there may be a voltage drop of 10, 12, 24, 90, 110 or 230 volts across the high-voltage light-emitting diode chip. The high-voltage light-emitting diode chip can thus be operated with a relatively high voltage of at least 4 V.

The piezo transformer may have at least two output connection positions, a high-voltage light-emitting diode comprising a high-voltage light-emitting diode chip electrically connected to each output connection position. In this case, each high-voltage light-emitting diode chip comprises at least two active regions connected in series with one another. This means that different high-voltage light-emitting diodes are supplied with operating current and with voltage by the piezo transformer via different output connection positions.

At least one of the high-voltage light-emitting diodes may comprise more than one high-voltage light-emitting diode chip, each high-voltage light-emitting diode chip comprising at least two active regions connected in series with one another.

The high-voltage light-emitting diode chips may in this case differ from one another by their optical and electrical properties. For example, the high-voltage light-emitting diode chips may differ from one another in their voltage consumption. Furthermore, the high-voltage light-emitting diode chips may emit electromagnetic radiation with wavelengths different from one another. In particular, combinations of high-voltage light-emitting diode chips emitting blue light, white light, mint-colored light, red light, warm white light and/or cold white light are possible. The different high-voltage light-emitting diode chips may be rigidly wired to one another or supplied with different currents by variable control elements, for example, switches, transistors, potentiometers, photoresistors or temperature-dependent resistors. Furthermore, the different high-voltage light-emitting diode chips may also be connected to different outputs of the piezo transformer, which may provide different voltages and maximum currents. In this case, it is possible in particular for the high-voltage light-emitting diodes to be formed by high-voltage light-emitting diode chips.

More than one high-voltage light-emitting diode connects to at least one of the output connection positions of the piezo transformer. The high-voltage light-emitting diodes connected to an output of the piezo transformer may, for example, be wired to one another in series, in parallel with one another or in combinations of a series and parallel connection.

It is again possible for the high-voltage light-emitting diodes to comprise at least one high-voltage light-emitting diode chip or, respectively, to consist of a high-voltage light-emitting diode chip.

At least one of the high-voltage light-emitting diodes or at least one of the high-voltage light-emitting diode chips can be operated with AC voltage. A high-voltage light-emitting diode chip operable with AC voltage may, for example, be achieved by connecting a first group of active regions of the high-voltage light-emitting diode chip in series with one another and connecting a second group of active regions of the high-voltage light-emitting diode chip in series with one another, the first group being connected in antiparallel to the second group. Besides an antiparallel interconnection of the active regions of the high-voltage light-emitting diode chip, interconnection in a Wheatstone bridge rectifier circuit is also possible.

For the case involving a high-voltage light-emitting diode which can be operated with AC voltage, the high-voltage light-emitting diode may comprise a plurality of high-voltage light-emitting diode chips connected in series and in antiparallel with one another. It is furthermore possible for the high-voltage light-emitting diode to comprise a high-voltage light-emitting diode chip and a rectifier integrated into the light-emitting diode.

If the high-voltage light-emitting diodes or the high-voltage light-emitting diode chips of the light-emitting diode arrangement cannot be operated with AC voltage, then the light-emitting diode arrangement preferably comprises at least one rectifier which may be connected upstream or downstream of the piezo transformer. Furthermore, other electronic components for smoothing and/or power factor improvement may be provided in the light-emitting diode arrangement, and connected to the piezo transformer and/or the high-voltage light-emitting diode.

Each of the output connection positions of the piezo transformer may provide a predeterminable output voltage and a predeterminable maximum output current. This means, in particular, that the output current provided by the piezo transformer is limited. The current limitation is an inherent property of a piezo transformer. Driving the high-voltage light-emitting diode of the light-emitting diode arrangement may therefore be carried out in a voltage-driven manner, without excessive variations or peaks in the current strength occurring for the high-voltage light-emitting diode. The voltage-driven driving leads to a very simple and therefore economical configuration of a driver of the light-emitting diode arrangement, and in particular elaborate constant-current electronics as a driver can be obviated. Furthermore, the current limitation of the piezo transformer leads to reduced ageing of the high-voltage light-emitting diodes since excessive peak currents are prevented by the use of the piezo transformer.

The output voltage and/or the maximum output current of two different output connection positions differ from one another. In the extreme case, the piezo transformer may provide an output current and/or an output voltage on each output connection position which differs from the output current and/or the output voltage of the rest of the output connection positions of the piezo transformer. In this way, in particular, the use of different-colored high-voltage light-emitting diodes on different output connection positions of the piezo transformer is particularly simple so that the light-emitting diode arrangement can generate light in a particularly large color space.

The piezo transformer may be formed as a frame, the piezo transformer laterally enclosing at least one of the high-voltage light-emitting diodes. Since the piezo transformer is formed using a ceramic material, different shapes are possible for the piezo transformer. In particular, it is possible for the piezo transformer to have an opening. The piezo transformer is then formed as a frame in the sense that an opening in the piezo transformer in the lateral direction is enclosed by the material of the piezo transformer. The high-voltage light-emitting diodes of the light-emitting diode arrangement may be arranged in this opening so that the high-voltage light-emitting diodes of the light-emitting diode arrangement or at least one high-voltage light-emitting diode of the light-emitting diode arrangement is enclosed laterally by the piezo transformer.

The light-emitting diode may be fastened directly on a connection carrier or a heat sink on which the piezo transformer, formed as a frame, is likewise arranged. The piezo transformer is in this case not arranged between the connection carrier, the heat sink and the high-voltage light-emitting diode, but instead it encloses the high-voltage light-emitting diode laterally. Heat generated by the high-voltage light-emitting diode during operation therefore does not need to be dissipated through the piezo transformer, for example, to reach the heat sink.

The light-emitting diode arrangement may comprise a connection carrier having a mounting face. The connection carrier is, for example, a circuit board such as a printed circuit board or a metal-core board. The connection carrier comprises, for example, an electrically insulating base body. Conductive tracks and/or electrical contact positions are structured in and/or on the insulating base body. The light-emitting diode arrangement furthermore may comprise at least one high-voltage light-emitting diode fastened on the mounting face of the connection carrier and electrically conductively connected to the connection carrier. The piezo transformer likewise electrically conductively connects to the connection carrier and the at least one high-voltage light-emitting diode connects via the connection carrier to the output connection position of the piezo transformer. This means that the electrical connection between the at least one high-voltage light-emitting diode of the light-emitting diode arrangement and the piezo transformer is carried out via the connection carrier.

The light-emitting diode arrangement may comprise a mechanical decoupler. The mechanical decoupler is arranged between the piezo transformer and the connection carrier and/or the heat sink and is, for example, in direct contact with the components. The mechanical decoupler comprises, for example, an elastic or resilient material. The mechanical decoupler prevents the transmission of vibrations of the piezo transformer, which occur during its operation, onto components next to the piezo transformer.

A light-emitting device is furthermore provided. The light-emitting device comprises at least one light-emitting diode arrangement comprising a piezo transformer having at least one input connection position and at least one output connection position, and a light-emitting diode comprising a light-emitting diode chip. The light-emitting diode and the light-emitting diode chip may be a high-voltage light-emitting diode and a high-voltage light-emitting diode chip, as described above. It is, however, also possible for the light-emitting diode to be a commercially available light-emitting diode comprising only one active region and/or having a voltage drop of less than 4 V during operation.

In particular, the light-emitting diode arrangement may be a light-emitting diode arrangement as described here comprising a high-voltage light-emitting diode with a high-voltage light-emitting diode chip. This means that all the features disclosed for the light-emitting diode arrangement are also disclosed for the light-emitting device, and vice versa.

Furthermore, the features of the light-emitting diode arrangement described here are also disclosed with use in the light-emitting device described here without the features of the high-voltage light-emitting diode or the high-voltage light-emitting diode chip. This means that a light-emitting diode arrangement formed with conventional light-emitting diodes and/or light-emitting diode chips, but which otherwise has some or all the features of the light-emitting diode arrangement described above, may be used in the light-emitting device.

The light-emitting device may comprise a housing body, enclosing a volume in which the light-emitting diode arrangement is fully arranged. The housing body is used, for example, to protect the light-emitting diode arrangement from contact and other mechanical effects. The housing body is, for example, formed with a metal and/or a plastic and/or a glass and/or a ceramic material.

The light-emitting device furthermore may comprise a base which comprises at least one base contact. The light-emitting device is preferably a so-called "retrofit." This means that, owing to the way in which the base is formed, the light-emitting device can be used instead of conventional incandescent lamps or halogen lamps. Depending on where the light-emitting device is intended to be used as a retrofit, the base may be configured as a screw base, tube base, plug-in base, pin base or the like. The light-emitting device is not in this case restricted to a particular number, operating voltage, emission color and/or interconnection of the light-emitting diodes of the light-emitting means. The light-emitting device is particularly variable and suitable for different power classes, for example, up to about 50 W power consumption, and any emission profiles such as "downlight," "spotlight" and "omnidirectional."

The light-emitting diode arrangement of the light-emitting device is supplied with electrical current from outside the light-emitting device via the at least one base contact, typically at least two base contacts.

The light-emitting diode may electrically connect to the output connection position of the piezo transformer, and the at least one input connection position of the piezo transformer may electrically conductively connect to the at least one base contact.

The light-emitting device may comprise at least one light-emitting diode arrangement having a piezo transformer having at least one input connection position and at least one output connection position, and having a light-emitting diode comprising a light-emitting diode chip. The light-emitting device furthermore comprises a housing body enclosing a volume in which the light-emitting diode arrangement is fully arranged, and a base comprising at least one base contact, the light-emitting diode being electrically connected to the output connection position of the piezo transformer and the at least one input connection position of the piezo transformer being electrically conductively connected to the at least one base contact.

By using the piezo transformer, which is distinguished in particular by its small volume, in the light-emitting device, for example, a particularly large amount of space is available in the light-emitting device for the light-emitting diode arrangement and, therefore, the light-generating component of the light-emitting device. Furthermore, the piezo transformer provides galvanic isolation. This makes it possible to save on second insulation of the connection carrier of the light-emitting diode arrangement from the housing body, or make any insulation thinner.

The light-emitting device may comprise a heat sink thermally conductively connected to the at least one light-emitting diode arrangement, wherein the heat sink is arranged fully in the volume enclosed by the housing body. The heat sink in this case occupies at least 20% of the volume enclosed by the housing body. Preferably, the heat sink fills at least 30%, particularly preferably at least 40% of the volume. This is made possible owing to the use of a piezo transformer in this case, which is distinguished by its reduced volume compared with a magnetically operating transformer. In this way it is possible, for example, for cooling fins of the heat sink to extend far into the volume enclosed by the housing body to achieve a particularly large cooling surface of the heat sink and consequently particularly good cooling by the heat sink. Furthermore, the larger available volume of the heat sink also offers more freedom in the design of the heat sink, which allows particularly variable configuration of the light-emitting device. For a given light flux, the increased thermal dissipation at the heat sink also improves the efficiency and the operating time of the light-emitting diodes and of the driver circuit for the light-emitting diodes.

To integrate the piezo transformer into the light-emitting device, it is preferable to use a frequency-generating transistor circuit. To obtain the maximum efficiency of the piezo transformer with varying temperatures, for example, due to the heat given off by the light-emitting diodes of the light-emitting device, a feedback element may be connected to one or all output connection positions of the piezo transformer, which feedback element feeds the output power of the piezo transformer back to the transistor circuit to optimize the operating frequency.

The piezo transformer may be arranged between the base and the connection carrier of the light-emitting diode arrangement. For example, the piezo transformer and the at least one connection carrier may be arranged on mutually opposite sides of the heat sink.

The light-emitting diode arrangement described here and the light-emitting device described here will be explained in more detail below with the aid of examples and the associated figures.

Elements which are the same, of the same type or have the same effect are provided with the same references in the figures. The figures and the size proportions of the elements represented in the figures with respect to one another are not to be regarded as true to scale. Rather, individual elements may be represented exaggeratedly large for better representation and/or better understanding.

Figure 1A:
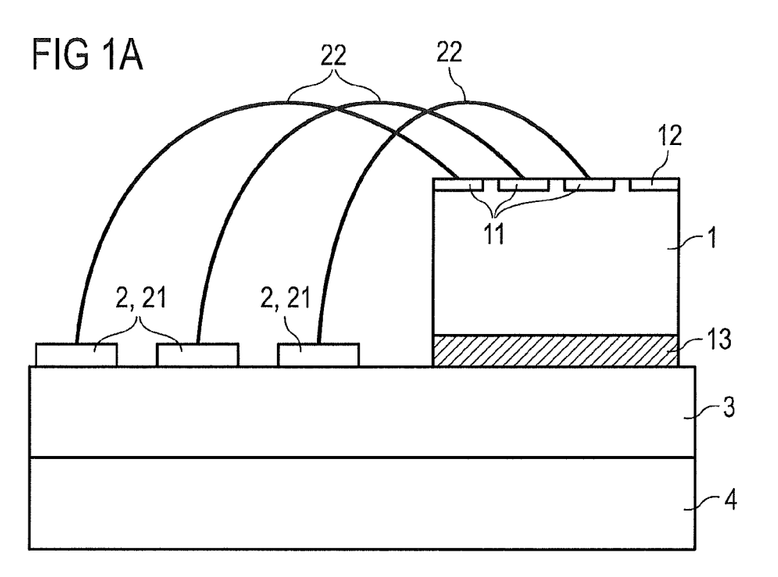
FIGS. 1A, 1B, 2A, 2B, 3A and 3B show schematic views of light-emitting diode arrangements.

FIG. 1A shows a first example of a light-emitting diode arrangement described here with the aid of a schematic sectional representation. The light-emitting diode arrangement comprises a piezo transformer 1 formed, for example, using a ceramic material. The piezo transformer 1 comprises output connection positions 11 and at least one input connection position 12.

The light-emitting diode arrangement furthermore comprises a connection carrier 3 which is, for example, a circuit board or a metal-core board. The piezo transformer 1 is fastened on a mounting face 3a on the connection carrier 3. A mechanical decoupler 13 is arranged between the piezo transformer 1 and the connection carrier 3. The mechanical decoupler 13 comprises, for example, an elastic or resilient material. The mechanical decoupler 13 prevents the transmission of vibrations of the piezo transformer 1, which occur during its operation, onto the connection carrier 3.

The mechanical decoupler 13 is, for example, formed using a synthetic rubber, latex rubber, an elastomer, a thermoplastic or an electrically insulated metal in the form of a spring.

On the connection carrier 3, the high-voltage light-emitting diodes 2 are furthermore arranged on the mounting face 3a. Each high-voltage light-emitting diode 2 may consist of a high-voltage light-emitting diode chip 21 or contain at least one high-voltage light-emitting diode chip 21.

The current provided by the piezo transformer during operation is, for example, delivered to the high-voltage light-emitting diodes 2 via bonding wires 22. Precisely one high-voltage light-emitting diode 2 may be connected to the piezo transformer on each output connection position 11. It is furthermore possible for a plurality of high-voltage light-emitting diodes 2 to be connected on an output connection position 11.

The light-emitting diode arrangement 7 furthermore comprises a heat sink 4 which, for example, consists of a metal such as copper or contains a metal. The heat sink 4 is arranged on the side of the connection carrier 3 facing away from the piezo transformer 1.

In contrast to the example of FIG. 1A, in the example which is described in connection with FIG. 1B, the high-voltage light-emitting diodes 2 which each comprise at least one high-voltage light-emitting diode chip 21 or consist of a high-voltage light-emitting diode chip 21, are fastened and electrically connected on the side of the piezo transformer 1 facing away from the connection carrier 3.

Figure 1B:
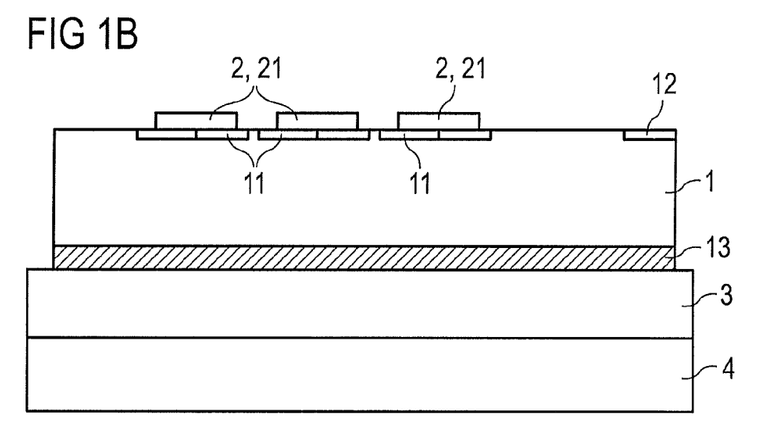

A disadvantage which may be found with the example of FIG. 1B is that heat generated during operation by the high-voltage light-emitting diode chips 2 has to pass through the piezo transformer 1 to reach the heat sink 4.

Figure 2A:
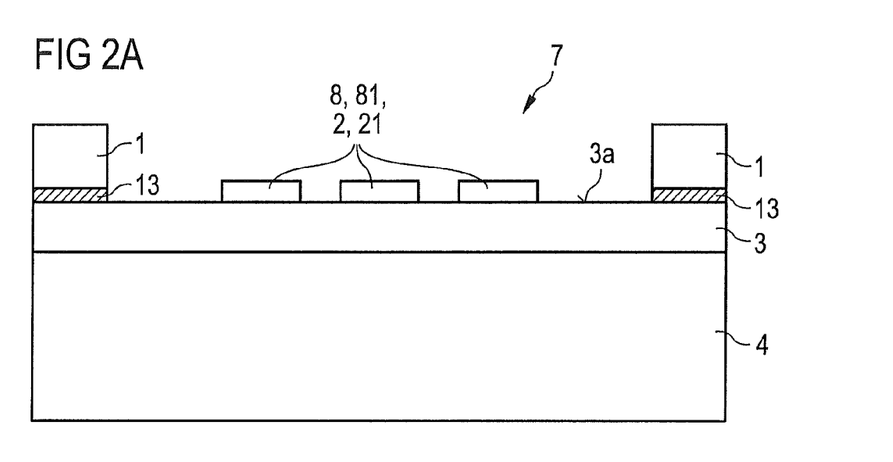
Figure 2B:
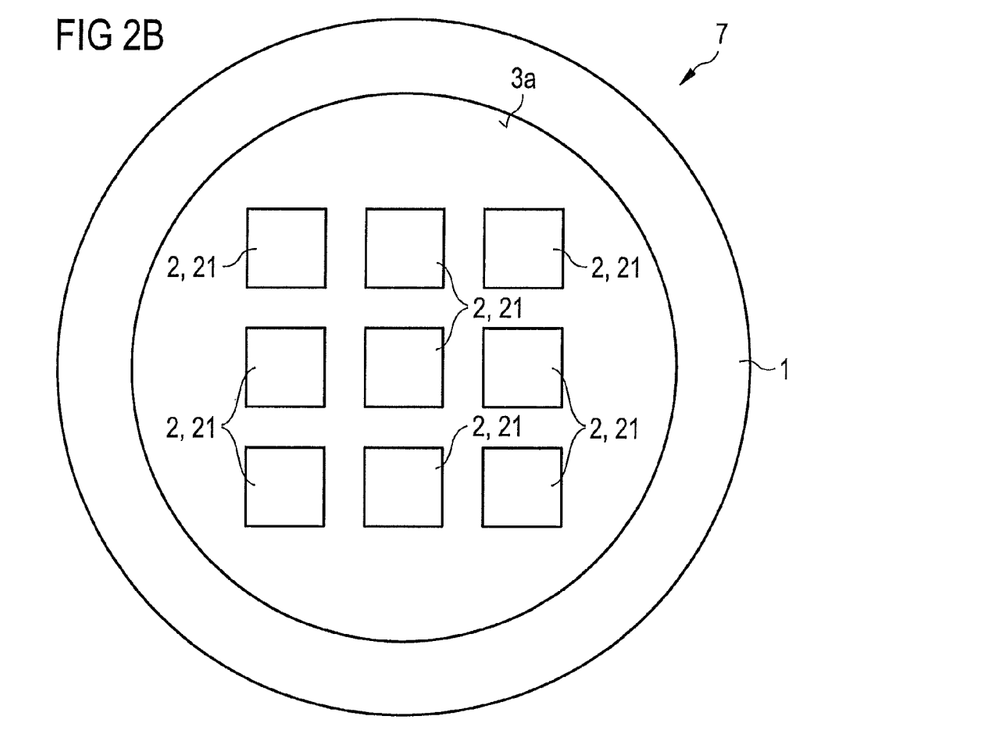

Another example of the light-emitting diode arrangement 7 described here will be explained in more detail in connection with the schematic sectional representation of FIG. 2A and the schematic plan view of FIG. 2B. In this example, the piezo transformer 1 is formed as a frame, in the present case as a ring. The piezo transformer 1 is likewise, that is to say in the same way as the high-voltage light-emitting diodes 2, fastened on the mounting face 3a of the connection carrier 3 and connected there electrically to the connection carrier 3 and via the connection carrier 3 to the high-voltage light-emitting diodes 2. The mechanical decoupler 13 is arranged between the piezo transformer 1 and the connection carrier 3. The heat sink 4 is arranged on the side of the connection carrier 3 facing away from the high-voltage light-emitting diodes 2 and the piezo transformer. This means that heat generated during operation by the high-voltage light-emitting diodes 2 does not have to pass through the piezo transformer to reach the heat sink 4. Furthermore, the piezo transformer 1 encloses the high-voltage light-emitting diodes 2 laterally and thereby constitutes mechanical support for the high-voltage light-emitting diodes 2.

The piezo transformer thus comprises a recess, which is enclosed as a frame by the material of the piezo transformer 1. In this recess, or in this opening, the high-voltage light-emitting diodes 2 are arranged on the connection carrier 3. It is in this case also possible for the high-voltage light-emitting diodes 2 to be applied directly on the heat sink 4, that is to say the heat sink 4 also fulfils the functions of the connection carrier 3.

In the example described in connection with FIGS. 2A and 2B, conventional light-emitting diodes 8 and/or conventional light-emitting diode chips 81 may also be used instead of or in addition to the high-voltage light-emitting diodes 2 or the high-voltage light-emitting diode chips 21.

Figure 3A:
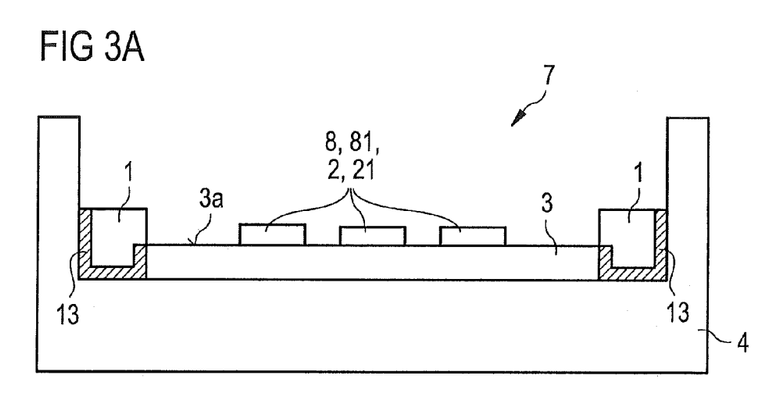
Figure 3B:
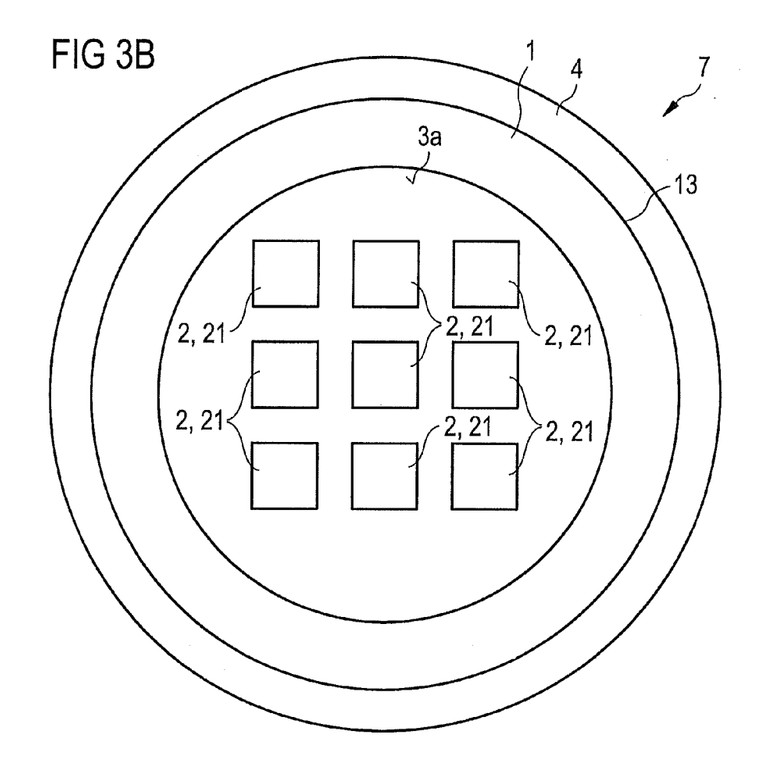

Another example of the light-emitting diode arrangement 7 described here will be explained in more detail in connection with the schematic sectional representation of FIG. 3A and the schematic plan view of FIG. 3B. In this example, in contrast to the example of FIGS. 2A, 2B, the piezo transformer 1 is arranged such that it also laterally encloses the connection carrier 3 as a frame. The piezo transform itself may be enclosed by the heat sink 4 on at least two sites, what leads to improved thermal dissipation from the piezo transformer 1. The mechanical decoupler 13 is arranged between the piezo transformer 1, the connection carrier 3 and the heat sink 14.

In the example described in connection with FIGS. 3A and 3B, conventional light-emitting diodes 8 and/or conventional light-emitting diode chips 81 may also be used instead of or in addition to the high-voltage light-emitting diodes 2 or the high-voltage light-emitting diode chips 21.

A first example of a light-emitting device described here will be explained in more detail in connection with the schematic sectional representation of FIG. 4A. The light-emitting device comprises a light-emitting diode arrangement 7 which may, for example, be configured as indicated in connection with FIGS. 1 to 3. The light-emitting diode arrangement 7 may comprise high-voltage light-emitting diodes 2 with high-voltage light-emitting diode chips 21 and/or conventional light-emitting diodes 8 with conventional light-emitting diode chips 81. The light-emitting device comprises a housing body 5, which may in the present case be formed using a reflective metal or a reflectively coated plastic. The housing body 5 encloses a volume 51 in which the light-emitting diode arrangement 7 with the piezo transformer 1 is fully arranged.

The light-emitting device furthermore comprises a base 6, with base contacts 61 via which the light-emitting means can be supplied from the outside with current and voltage. In the present case, the base 6 is formed as a plug-in base.

Figure 4A:
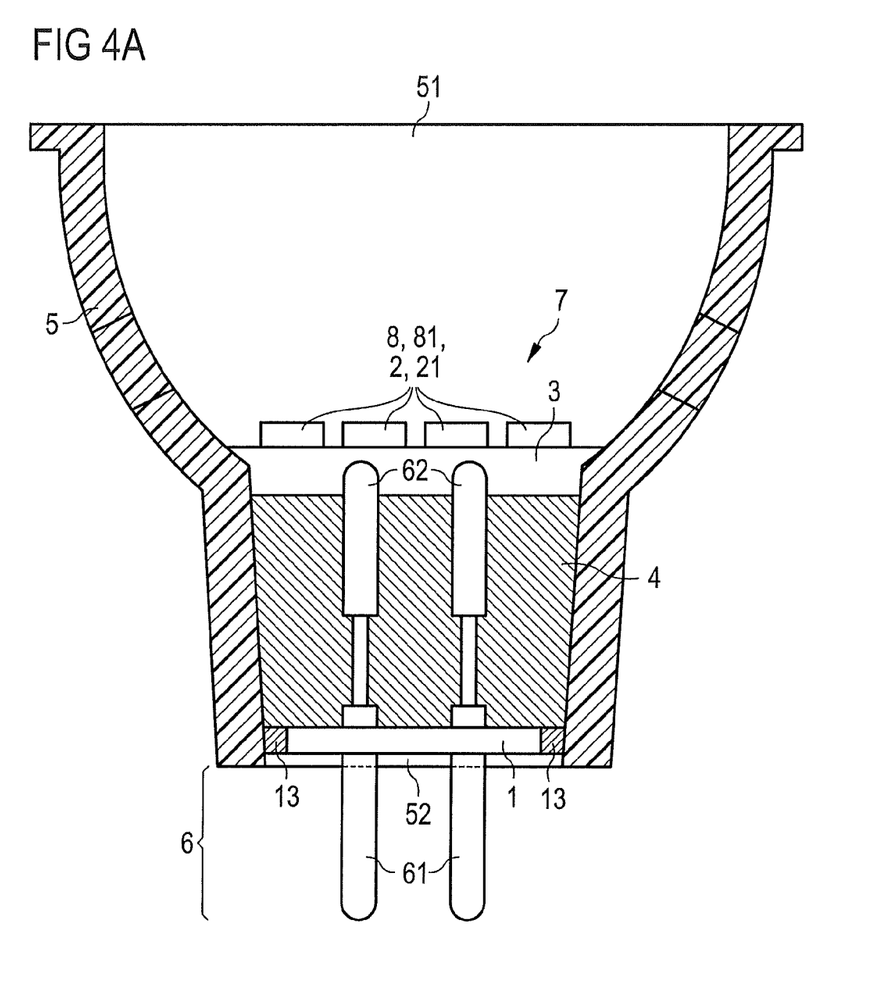
FIGS. 4A, 4B and 5 show schematic views of light-emitting devices.

In the example of FIG. 4A, the piezo transformer is arranged on a side of the heat sink 4 facing away from the connection carrier 3. The piezo transformer 1 is therefore arranged between the base 6 and the connection carrier 3. For electrical insulation of the base contacts 61 and the electrical connections 62, which extend through the heat sink 4 to the connection carrier 3, an electrical insulation 52 is arranged between the base 6 and the piezo transformer 1.

The piezo transformer 1 is fastened on the housing body 5 such that it can vibrate via a mechanical decoupler 13, for example, via an elastomer.

In this example, the heat sink 4 occupies a particularly large proportion of the volume 51 which is enclosed by the housing body 5. In the present case, the heat sink 4 takes up about one third of the enclosed volume 51.

Figure 4B:
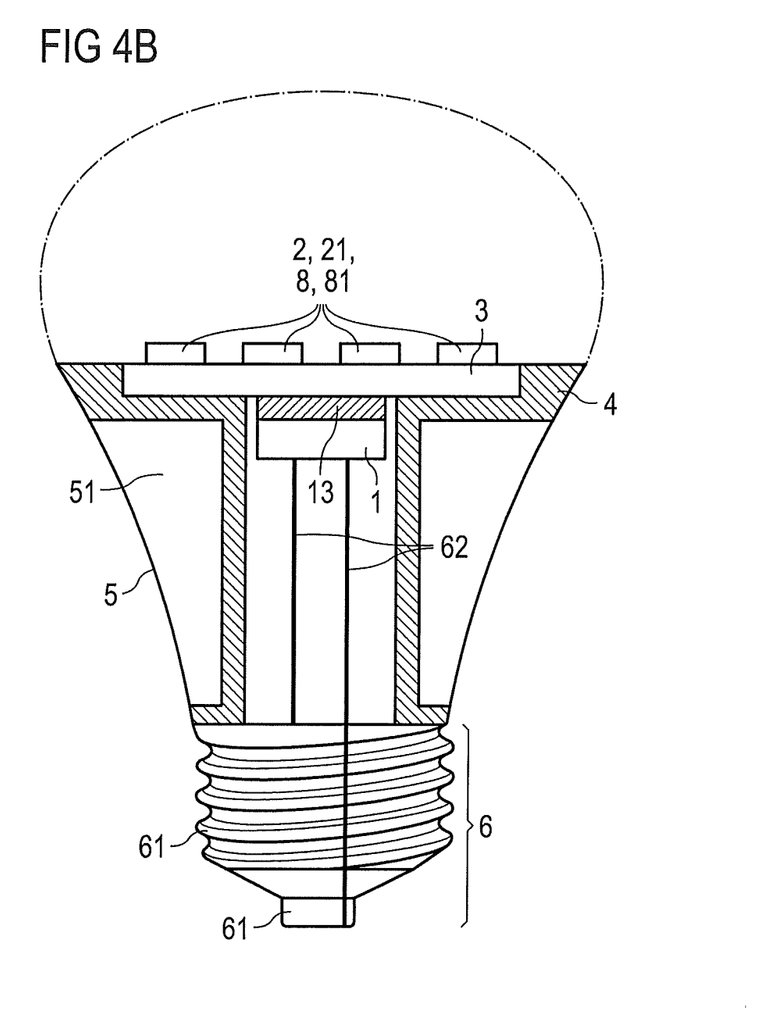

Another example of a light-emitting device described here will be explained in connection with FIG. 4B with the aid of a schematic sectional representation.

In this example, the base 6 is formed as a screw base. The piezo transformer 1 is fastened with vibration damping on the connection carrier 3 on its side facing away from the light-emitting diodes 2, 8. The piezo transformer 1 is laterally enclosed by cooling fins 41 of the heat sink. The cooling fins 41 of the heat sink 4 can in this way extend particularly far into the housing 5, so that they occupy a large part of the volume 51. The heat exchange with the ambient air is therefore maximized.

Figure 5:
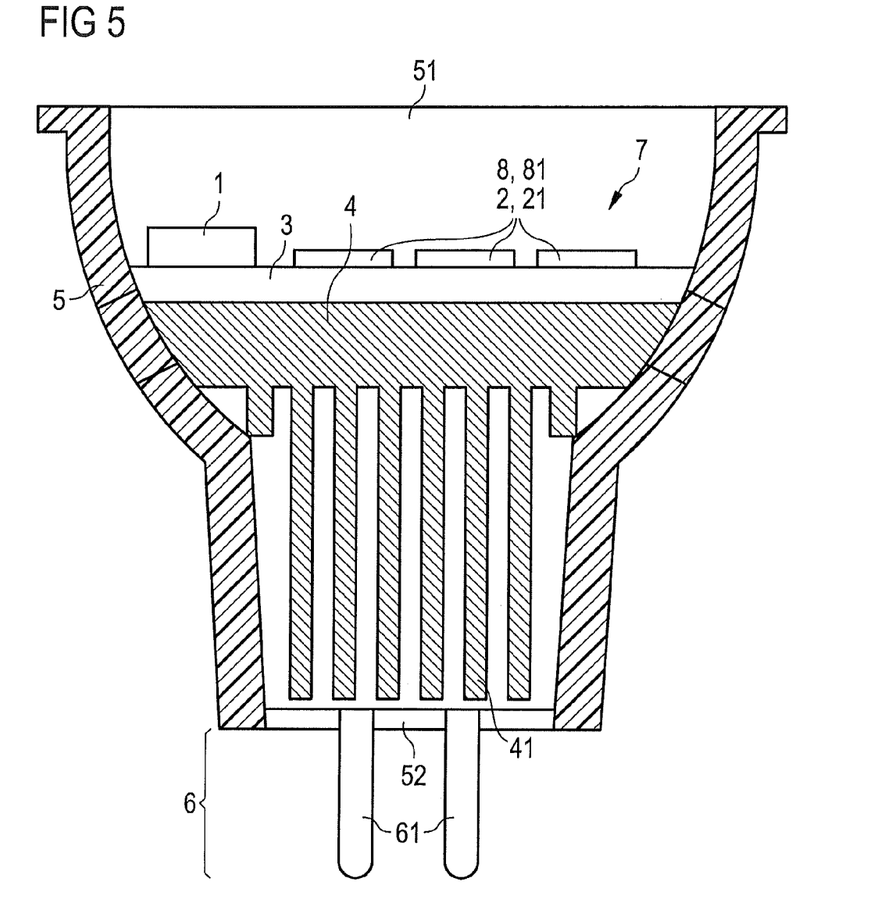

Another example of a light-emitting device described here will be explained in connection with FIG. 5 with the aid of a schematic sectional representation. In this example, the piezo transformer is arranged and electrically connected together with the light-emitting diodes 2, 8 on the mounting face 3a of the connection carrier 3. The heat sink 4 is located on the side of the connection carrier 3 facing away from the mounting face 3a. Cooling fins 41 of the heat sink 4 extend into the enclosed volume 51. In the present case, the heat sink 4 occupies more than 50% of the volume 51 which is enclosed by the housing body 5. Such a light-emitting means proves particularly advantageous in respect of its thermal properties.

A high-voltage light-emitting diode 21, such as may be used in light-emitting diode arrangements and light-emitting devices described here, will be explained in more detail in connection with the schematic sectional representation of FIG. 6. The high-voltage light-emitting diode 21 comprises a carrier 205, which may, for example, be formed using an electrically conductive or electrically insulating material. If the carrier is electrically conductive, an insulating layer 206a is arranged on the carrier 205.

A contact layer 208, which is used for making contact with active regions 200 which are provided for the radiation generation, is applied on the carrier 205. The contact layer 208 is covered at least partially by an insulating layer 206b, which is formed, for example, using silicon dioxide. The insulating layer 206b comprises openings 207, in which electrically conductive contact between the contact layer 208 and the active regions 200 is made possible.

The high-voltage light-emitting diode chip 21 is divided into at least two and at most $n=(V_{mains}\sqrt{2}/V_f)$ pixels 210. $V_{mains}$ is the mains voltage and $V_f$ is the forward voltage, which is the voltage drop across an active region 200 of the high-voltage light-emitting diode chip.

Each pixel 210 comprises a p-contact layer 212 arranged between the insulating layer 206b and the p-conductive region 202. The p-side terminal 211 of the high-voltage light-emitting diode chip 21 electrically connects to the p-contact layer 212. Both charge carrier types are therefore delivered laterally from the side facing away from the emission side of the high-voltage light-emitting diode chip, i.e., distributed over the active regions 200, and to the respective conductive regions 201, 202.

The pixels in the present case are connected in series, the p-conductive region 202 of a pixel 210 being electrically conductively connected to the n-conductive region 201 of a neighboring pixel.

Figure 6:
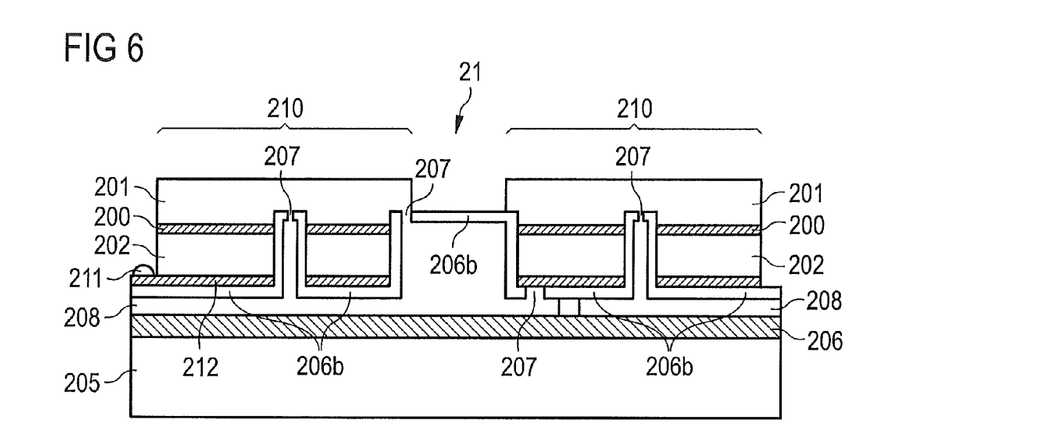
FIGS. 6 and 7 show schematic views of high-voltage light-emitting diode chips.

In the example of FIG. 6, the pixels 210 and therefore the active regions 200 of the high-voltage light-emitting diode are arranged laterally next to one another.

As an alternative, a high-voltage light-emitting diode, such as may be used in the present case, will be described in connection with FIG. 7. In this example, the active regions 200 connect in series with one another and are vertically stacked above one another. Electromagnetic radiation with the same or different wavelengths can be generated in the active regions 200. A tunnel contact may be arranged between the n-conductive layer 201 and the p-conductive layer 202, which adjoin one another in the high-voltage light-emitting diode chip 21.

Figure 7:
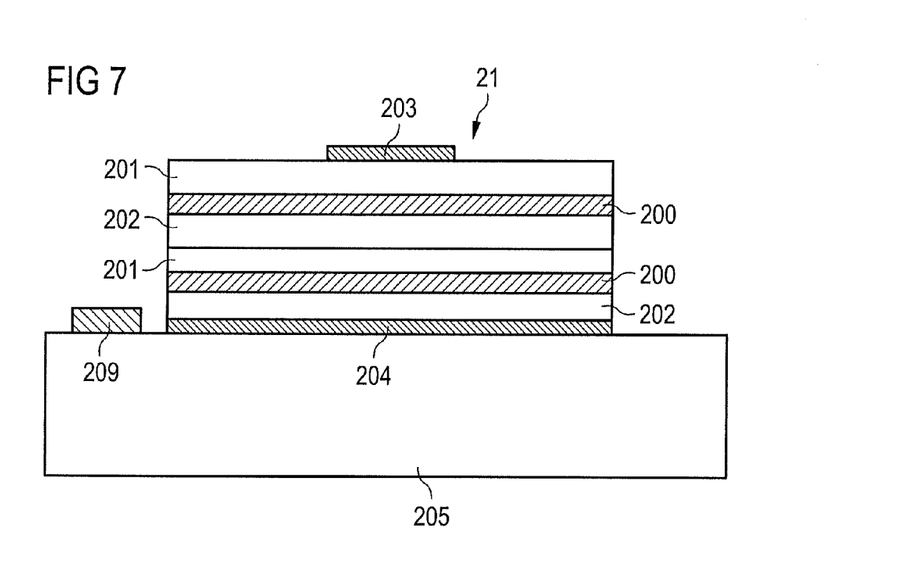

Beside the semiconductor layers of the high-voltage light-emitting diode chip 21, in the example of FIG. 7, a series resistor 209 is arranged on the carrier 204. A high-voltage light-emitting diode chip as described in FIG. 7 is also specified, in a different context, for example, in WO 2008/040300 A1, the subject matter of which is incorporated herein by reference.

Figure 8:
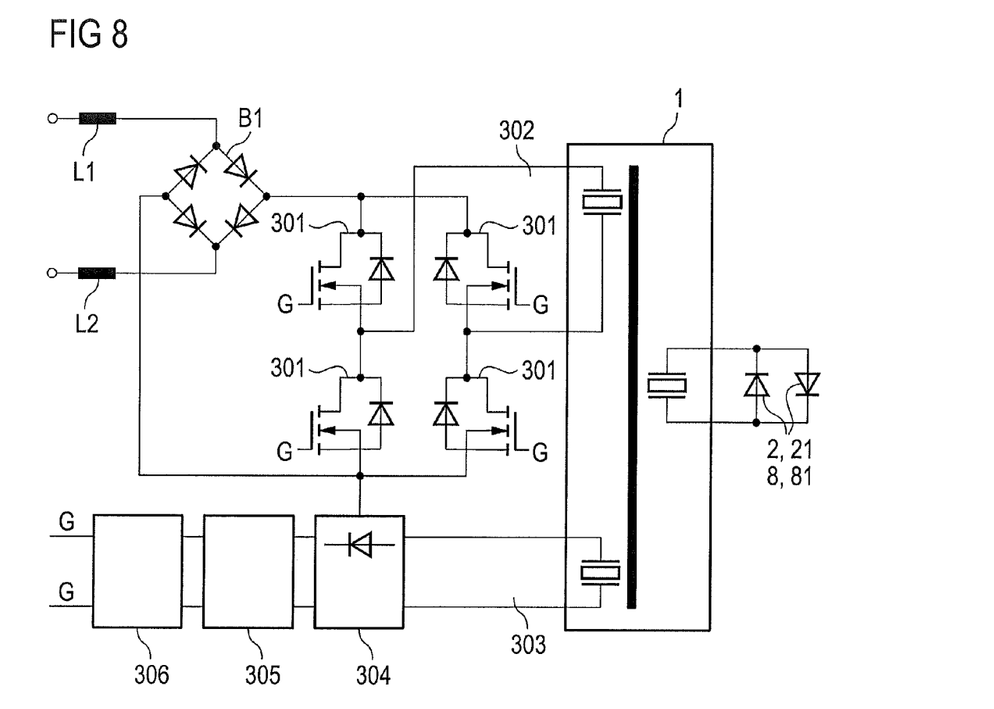
FIG. 8 shows a schematic circuit diagram of a light-emitting diode arrangement.

FIG. 8 shows a schematic circuit diagram of a light-emitting diode arrangement described here. The light-emitting diode arrangement of FIG. 8 comprises the following components: inductors L1, L2, a rectifier B1, field-effect transistors 301, a supply input 302, the piezo transformer 1, the light-emitting diodes or light-emitting diode chips 2, 21, 8, 81 of the light-emitting diode arrangement, an auxiliary output 303, a rectifier and a low-pass filter 304, a maximum detector 305 and a voltage-controlled oscillator (VCO) 306. To integrate the piezo transformer 1, for example, into the light-emitting device described here, a frequency-generating transistor circuit may be used. To obtain the maximum efficiency of the piezo transformer 1 with varying temperatures, for example, due to the heat given off by the light-emitting diodes of the light-emitting device, a feedback element may be connected to one or all output connection positions of the piezo transformer 1, which feedback element feeds the output power of the piezo transformer 1 back to the transistor circuit to optimize the operating frequency.

The voltage-controlled oscillator 306 of the circuit shown in FIG. 8 can change the frequencies as a function of the input voltage. The voltage-controlled oscillator 306 is in this case configured so that at least the frequency resonance range over all temperatures and loads can be driven. For example, the maximum detector 305 is connected directly to the voltage-controlled oscillator 306.

The maximum detector 305 is a regulator, which regulates the signal for the voltage-controlled oscillator 306 such that the voltage at the output of the subsequent component, rectifier and low-pass filter 304, always reaches the maximum possible, i.e., the maximum energy transmission.

For example, the rectifier and low-pass filter 304 are connected directly to the maximum detector. This component generates a signal proportional to the peak value of the transmitted power at the auxiliary output 303 of the piezo transformer 1.

At the supply input 302, the field-effect transistors 301 form a power stage for driving the primary side of the piezo transformer 1. It is in this case possible to carry out this driving in an alternative way, for example, using a transistor.

By the description with the aid of the examples, this disclosure is not restricted to the examples. Rather, the disclosure encompasses any new feature and any combination of features, which may in particular comprise any combination of features in the appended claims, even if the feature or combination is not itself indicated explicitly in the claims or examples.

The invention claimed is:

1. A light-emitting diode arrangement comprising:
   a piezo transformer having at least one output connection position, and
   a high-voltage light-emitting diode comprising a high-voltage light-emitting diode chip comprising at least two active regions connected in series with one another,
   wherein
   the high-voltage light-emitting diode is electrically connected to the output connection position of the piezo transformer, and
   the piezo transformer is a frame and the piezo transformer laterally encloses at least one of the high-voltage light-emitting diodes.

2. The light-emitting diode arrangement according to claim 1, wherein the piezo transformer vertically projects beyond the enclosed at least one high-voltage light-emitting diode.

3. The light-emitting diode arrangement according to claim 1, wherein the piezo transformer has at least two output connection positions and a high-voltage light-emitting diode comprising a high-voltage light-emitting diode chip electrically connected to each output connection position, each high-voltage light-emitting diode chip comprising at least two active regions connected in series with one another.

4. The light-emitting diode arrangement according to claim 1, wherein at least one of the high-voltage light-emitting diodes comprises more than one high-voltage light-emitting diode chip, each high-voltage light-emitting diode chip comprising at least two active regions connected in series with one another.

5. The light-emitting diode arrangement according to claim 3, wherein more than one high-voltage light-emitting diode is connected to at least one of the output connection positions of the piezo transformer.

6. The light-emitting diode arrangement according to claim 1, wherein at least one of the high-voltage light-emitting diodes or at least one of the high-voltage light-emitting diode chips is operable with AC voltage.

7. The light-emitting diode arrangement according to claim 3, wherein each of the output connection positions of the piezo transformer provides a predeterminable output voltage and a predeterminable maximum output current.

8. The light-emitting diode arrangement according to claim 7, wherein the output voltage and/or the maximum output current of two different output connection positions differs.

9. The light-emitting diode arrangement according to claim 1, further comprising:
   a connection carrier having a mounting face,
   wherein
   at least one of the high-voltage light-emitting diodes is fastened on the mounting face and electrically conductively connected to the connection carrier,
   the piezo transformer electrically conductively connects to the connection carrier, and
   the at least one of the high-voltage light-emitting diodes connects via the connection carrier to the output connection position of the piezo transformer.

10. A light-emitting device comprising:
    at least one light-emitting diode arrangement comprising a piezo transformer having at least one input connection position and at least one output connection position, and a light-emitting diode comprising a light-emitting diode chip,
    a housing body encloses a volume in which the light-emitting diode arrangement is fully arranged,
    a base comprising at least one base contact,
    wherein
    the light-emitting diode electrically connects to the output connection position of the piezo transformer, and
    the at least one input connection position of the piezo transformer electrically conductively connects to the at least one base contact;
    wherein the piezo transformer is a frame and the piezo transformer laterally encloses at least one of the light-emitting diodes.

11. The light-emitting device according to claim 10, wherein
    the piezo transformer has at least one output connection position, and
    the high-voltage light-emitting diode chip comprises at least two active regions connected in series with one another,
    wherein
    the high-voltage light-emitting diode electrically connects to the output connection position of the piezo transformer.

12. The light-emitting device according to claim 10, further comprising:
    a heat sink thermally conductively connected to the at least one light-emitting diode arrangement,
    wherein
    the heat sink is fully arranged in the volume enclosed by the housing body, and
    the heat sink occupies at least 20% of the volume.

13. The light-emitting device according to claim 10, wherein the piezo transformer is arranged between the base and the connection carrier.

14. The light-emitting device according to claim 13, wherein the piezo transformer and the at least one connection carrier are arranged on mutually opposite sides of the heat sink.

15. The light-emitting device according to claim 10, wherein the piezo transformer vertically projects beyond the enclosed at least one light-emitting diode.

\* \* \* \* \*